US012637254B2

(12) United States Patent
Sebastian et al.

(10) Patent No.: US 12,637,254 B2
(45) Date of Patent: May 26, 2026

(54) PACKAGE WRAPPING INCLUDING PLA FILM WITH MOISTURE BARRIER BY ATOMIC LAYER DEPOSITION

(71) Applicant: R.J. REYNOLDS TOBACCO PRODUCTS, Winston-Salem, NC (US)

(72) Inventors: Andries Don Sebastian, Clemmons, NC (US); Sami Ilmari Sneck, Espoo (FI); Mikko Juhani Söderlund, Helsinki (FI)

(73) Assignee: R.J. Reynolds Tobacco Company, Winston-Salem, NC (US)

( * ) Notice: Subject to any disclaimer, the term of this patent is extended or adjusted under 35 U.S.C. 154(b) by 1131 days.

(21) Appl. No.: 16/537,323

(22) Filed: Aug. 9, 2019

(65) Prior Publication Data

US 2019/0359401 A1     Nov. 28, 2019

Related U.S. Application Data

(62) Division of application No. 15/208,352, filed on Jul. 12, 2016, now Pat. No. 10,472,150.

(51) Int. Cl.
*C23C 16/40* (2006.01)
*B65D 25/36* (2006.01)
(Continued)

(52) U.S. Cl.
CPC ............. *B65D 25/36* (2013.01); *B65D 65/02* (2013.01); *B65D 65/40* (2013.01);
(Continued)

(58) Field of Classification Search
None
See application file for complete search history.

(56) References Cited

U.S. PATENT DOCUMENTS

| 3,695,422 A | 10/1972 | Tripodi |
| 3,874,581 A | 4/1975 | Fox et al. |

(Continued)

FOREIGN PATENT DOCUMENTS

| EP | 0 392 737 A1 | 10/1990 |
| EP | 1 634 699 A1 | 3/2006 |

(Continued)

OTHER PUBLICATIONS

International Search Report and Written Opinion in related application PCT/US2017/040361, Sep. 13, 2017, 9 pages.

(Continued)

*Primary Examiner* — Mandy C Louie
(74) *Attorney, Agent, or Firm* — Womble Bond Dickinson (US) LLP

(57) ABSTRACT

Provided herein is a moisture barrier film for packaging, such as tobacco or cigarette packaging. The film comprises polylactic acid ("PLA") that is both biodegradable and transparent. The film includes multiple layers of PLA, with a base layer having a relatively high melting point compared to two outer layers, which have a relatively low melting point. The outer layers provide heat sealing capabilities to the film. The film is coated with a metal oxide layer comprised of aluminum oxide, titanium oxide, and/or aluminum-titanium oxide using an atomic layer deposition ("ALD") coating method. The ALD coating to the PLA film results in a moisture transmission rate of less than 4 g/m2/ day after the film has been subjected to creasing, which induces cracking of the ALD metal oxide layer.

12 Claims, 5 Drawing Sheets

(51) Int. Cl.
|  |  |
|---|---|
| *B65D 65/02* | (2006.01) |
| *B65D 65/40* | (2006.01) |
| *B65D 85/10* | (2006.01) |
| *C23C 16/06* | (2006.01) |
| *C23C 16/455* | (2006.01) |

(52) U.S. Cl.
CPC .......... *B65D 85/1045* (2013.01); *C23C 16/06* (2013.01); *C23C 16/40* (2013.01); *C23C 16/403* (2013.01); *C23C 16/405* (2013.01); *C23C 16/45525* (2013.01); *C23C 16/45555* (2013.01); *Y02W 90/10* (2015.05)

(56) References Cited

U.S. PATENT DOCUMENTS

| 3,944,066 | A | 3/1976 | Niepmann |
|---|---|---|---|
| 4,717,017 | A | 1/1988 | Sprinkel et al. |
| 4,807,745 | A | 2/1989 | Langley et al. |
| 4,852,734 | A | 8/1989 | Allen et al. |
| 5,139,140 | A | 8/1992 | Burrows et al. |
| 5,248,031 | A | 9/1993 | Burrows et al. |
| 5,333,729 | A | 8/1994 | Wolfe |
| 5,379,889 | A | 1/1995 | Cobler |
| 6,364,106 | B1 | 4/2002 | Fagg et al. |
| 7,014,039 | B2 | 3/2006 | Henson et al. |
| 7,048,115 | B2 | 5/2006 | Stringfield |
| 7,228,961 | B2 | 6/2007 | Koetter et al. |
| 7,823,731 | B2 | 11/2010 | Wu |
| 8,118,161 | B2 | 2/2012 | Guerrera et al. |
| 8,522,515 | B2 | 9/2013 | Carter et al. |
| 2006/0046006 | A1 | 3/2006 | Bastion et al. |
| 2006/0275926 | A1 | 12/2006 | Carcia et al. |
| 2007/0193896 | A1 | 8/2007 | Tanbo et al. |
| 2007/0261704 | A1 | 11/2007 | Tanbo et al. |
| 2007/0275926 | A1 | 11/2007 | Hoke et al. |
| 2008/0230410 | A1 | 9/2008 | Jones et al. |
| 2010/0323196 | A1* | 12/2010 | Dou ..................... B32B 27/308 264/173.16 |
| 2011/0039098 | A1 | 2/2011 | Forloni et al. |
| 2011/0171489 | A1 | 7/2011 | Dou et al. |
| 2011/0244186 | A1* | 10/2011 | Dou ....................... B29C 48/08 428/458 |
| 2011/0274892 | A1* | 11/2011 | Chang .................... B32B 27/08 156/244.11 |
| 2012/0201860 | A1 | 8/2012 | Weimer et al. |
| 2012/0288693 | A1 | 11/2012 | Stanley et al. |
| 2013/0004733 | A1* | 1/2013 | Iwashita ............. C23C 14/5886 428/192 |
| 2013/0034689 | A1* | 2/2013 | Hunt ....................... B32B 27/08 428/688 |
| 2013/0292279 | A1 | 11/2013 | Bengtsson et al. |
| 2016/0135499 | A1 | 5/2016 | Sebastian et al. |
| 2017/0067151 | A1* | 3/2017 | Nangou ................ C23C 28/042 |

FOREIGN PATENT DOCUMENTS

| JP | H1034807 | 2/1998 |  |  |
|---|---|---|---|---|
| JP | 2005-053223 | 3/2005 |  |  |
| JP | 2005119160 | 5/2005 |  |  |
| JP | 2007136770 | 6/2007 |  |  |
| JP | 2009-154926 | 7/2009 |  |  |
| JP | 201018023 | 8/2011 |  |  |
| JP | 2015-148007 | 8/2015 |  |  |
| RU | 2202504 C2 | 4/2003 |  |  |
| WO | WO-98/22367 A1 | 5/1998 |  |  |
| WO | WO-2011/123682 A1 | 10/2011 |  |  |
| WO | WO-2016136935 A1 * | 9/2016 | .............. | B05D 1/60 |

OTHER PUBLICATIONS

Office Action for JP Application No. 2019-500628, dated Jun. 8, 2021.

Office Action and Search Report in RU 2018146574, Jun. 29, 2020, 10 pages (with English translation).

Examination Report in ID PID201900512, Aug. 14, 2020, 3 pages (with partial English translation).

Office Action for BR Application No. 112019000463-7, dated Nov. 9, 2021.

Office Action and Search Report in CL 2010900071, Dec. 16, 2019, 24 pages with translation.

Extended European Search Report for EP 17828184.6, Feb. 4, 2020, 5 pages.

* cited by examiner

100

600

Form the cigarette pack — 602

Insert contents into the cigarette pack — 604

Close the cigarette pack — 606

Wrap the cigarette pack with the film — 608

Seal the film — 610

PACKAGE WRAPPING INCLUDING PLA FILM WITH MOISTURE BARRIER BY ATOMIC LAYER DEPOSITION

CROSS-REFERENCE TO RELATED APPLICATIONS

This application is a divisional of U.S. patent application Ser. No. 15/208,352 filed Jul. 12, 2016, the content of which is hereby incorporated by reference in its entirety.

FIELD OF THE DISCLOSURE

The present disclosure relates to a moisture barrier package wrapping.

DISCLOSURE OF RELATED ART

Cigarettes conventionally have been sold in packages, with each package often containing twenty (20) cigarettes. Typical cigarette packages have a generally rectangular parallelepiped form. One type of popular cigarette package employs a container having the form of a so-called "hard pack," "crush proof box" or "hinged lid package." See, for example, U.S. Pat. No. 3,874,581 to Fox et al.; U.S. Pat. No. 3,944,066 to Niepmann; U.S. Pat. No. 4,852,734 to Allen et al.; European Pat. 0392737 to Moeller; and U.S. Pub. Pat. App. No. 2008/0230410 to Jones et al., each of which is incorporated herein by reference. Another type of popular cigarette package employs a container having the form of the so-called "soft pack." See, for example, U.S. Pat. No. 3,695,422 to Tripodi; U.S. Pat. No. 4,717,017 to Sprinkel et al.; and U.S. Pat. No. 5,333,729 to Wolfe, each of which is incorporated herein by reference. Both types of cigarette packages are normally packed in cartons also of generally rectangular parallelepiped form, typically ten (10) packages to a carton.

Additional examples of cigarette packages can be found in U.S. Pat. No. 8,522,515 to Carter et al.; U.S. Pat. No. 8,118,161 to Guerrera et al.; U.S. Pat. No. 7,823,731 to Wu; U.S. Pat. No. 7,228,961 to Koetter et al.; U.S. Pat. No. 7,048,115 to Stringfield; U.S. Pat. No. 7,014,039 to Henson et al.; U.S. Pat. No. 6,364,106 to Fagg et al.; U.S. Pat. No. 5,379,889 to Cobler et al.; U.S. Pat. No. 5,248,031 to Burrows et al.; U.S. Pat. No. 5,139,140 to Burrows et al.; and U.S. Pat. No. 4,807,745 to Langley et al., each of which is incorporated herein by reference.

The above-identified cigarette packages are typically formed from folded and glued paper material. The paper material provides the structural rigidity for the cigarette packages. However, paper board in it of itself does not provide the necessary moisture retention properties for proper storage of tobacco products. Accordingly, most commercial cigarette packages are enclosed within a plastic film that prevents moisture loss from within the pack to the outside. The plastic films are typically a petroleum derived transparent biaxially oriented and heat sealable polypropylene film that has an inherent moisture barrier. The moisture transmission rate through these polypropylene films is about 4 g/m$^2$/day when measured at 38° C. and 90% relative humidity by ASTM D1249. This moisture barrier keeps the tobacco within the pack moist for a several months while such that the packages can have a multi-month shelf life. However these films are not considered sustainable because of the petroleum based origin. Further, the petroleum derived plastic films are not biodegradable to any extent and contribute to landfill waste.

Accordingly, it would be desirable to provide a sustainably sourced transparent film that is biodegradable and that provides necessary moisture barrier characteristics.

SUMMARY

The above and other needs are met by aspects of the present disclosure which, in a first aspect, provides a moisture barrier coated film. The film includes a first layer comprising a first material having a first melting point. The film further includes a second layer comprising a second material having a second melting point. The second melting point is lower than the first melting point. The first side of the second layer bonded to a first side of the first layer. The film includes a moisture barrier coating applied to a second side of the second layer, the moisture barrier coating comprising a metal-oxide.

In second aspect, a method of making a film having a moisture barrier coating is provided. The method includes forming a first layer comprising a first material having a first melting point. The method further includes forming a second layer comprising a second material having a second melting point. The second melting point is lower than the first melting point. The first side of the second layer bonded to a first side of the first layer. The method further includes coating a second side of the second layer with a moisture barrier coating comprising a metal-oxide. The second side of the second layer opposite the first side of the second layer.

In a third aspect, provides a package is provided. The package includes a main body and a top formed of a paper material. The package includes a central compartment formed by the top and the main body. The package further includes a wrapping formed of a film. The film includes a first layer comprising a first material having a first melting point and a second layer comprising a second material having a second melting point. The second melting point is lower than the first melting point. A first side of the second layer bonded to a first side of the first layer. The film further includes a moisture barrier coating applied to a second side of the second layer, the moisture barrier coating comprising a metal-oxide.

Further features and advantages of the present disclosure are set forth in more detail in the following description.

BRIEF DESCRIPTION OF THE DRAWINGS

Figure 1:
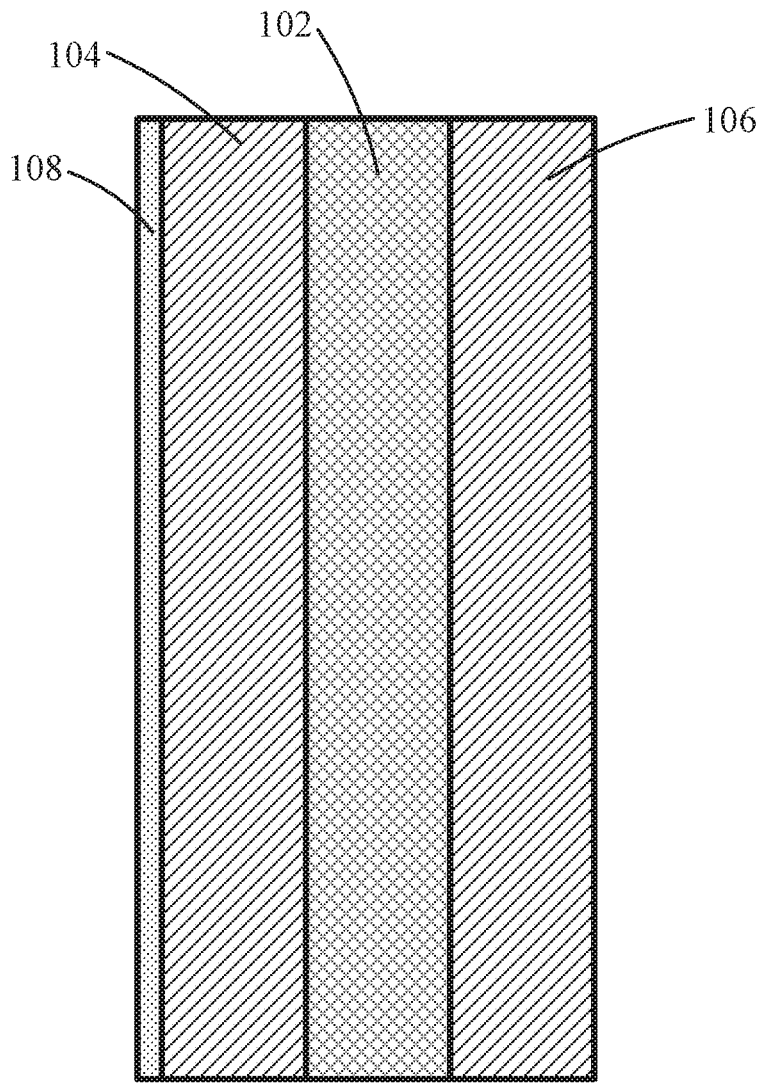
Figure 2:
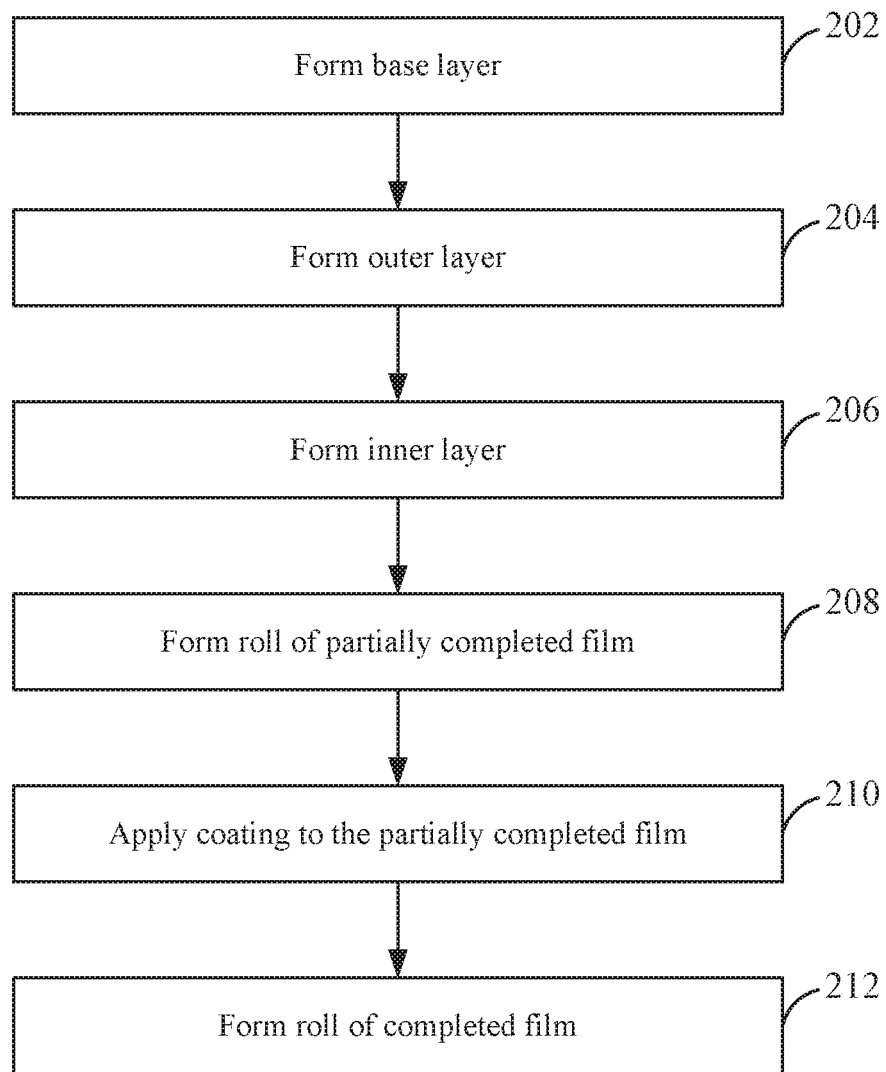
Figures 3, 4:
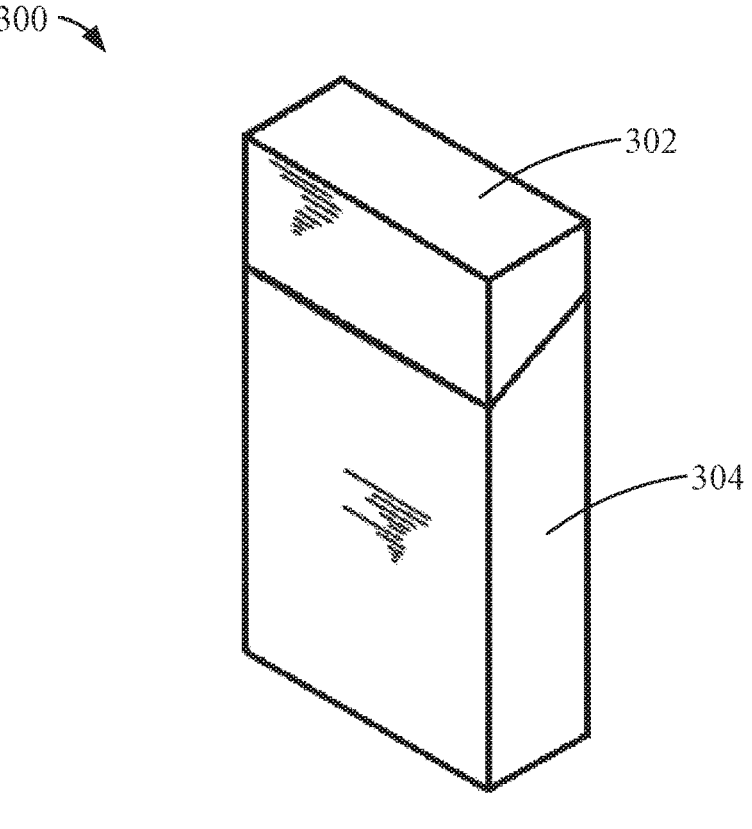
Figure 5:
Figure 5:
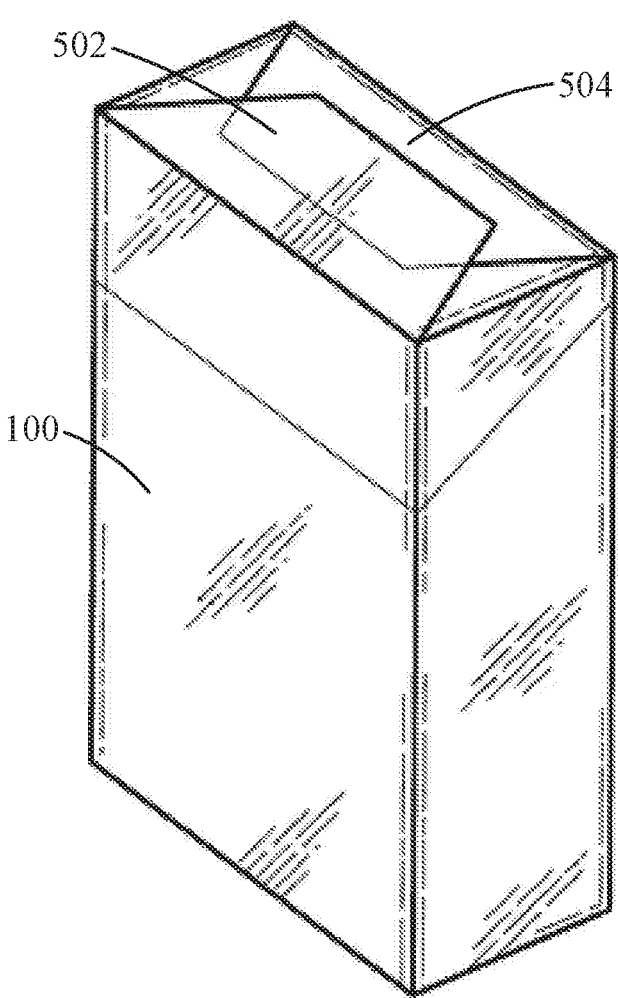
Figure 6:
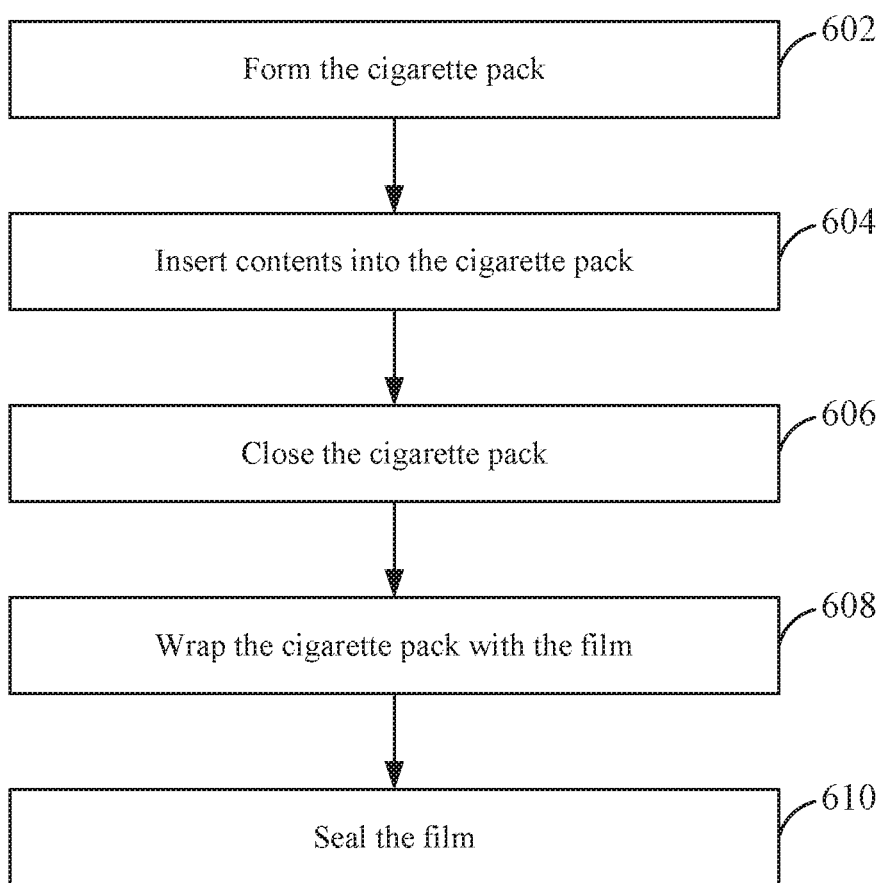

Having thus described the disclosure in general terms, reference will now be made to the accompanying drawings, which are not necessarily drawn to scale, and wherein:

FIG. 1 is a cross-sectional view of a moisture barrier film according to an example embodiment;

FIG. 2 is a flow diagram of a method of making the moisture barrier film of FIG. 1 according to an example embodiment;

FIG. 3 is a perspective view of a cigarette pack formed according to an example embodiment;

FIG. 4, is another perspective view of the cigarette pack of FIG. 3;

FIG. 5 is a view of the cigarette pack of FIG. 3 wrapped in the film of FIG. 1; and FIG. 6 is a flow diagram of a method of making a cigarette pack wrapped in the film of FIG. 1 is shown according to an example embodiment.

DETAILED DESCRIPTION OF THE DISCLOSURE

The present disclosure now will be described more fully hereinafter with reference to the accompanying drawings, in which some, but not all aspects of the disclosure are shown. Indeed, the disclosure may be embodied in many different forms and should not be construed as limited to the aspects set forth herein; rather, these aspects are provided so that this disclosure will be thorough and complete, will fully convey the scope of the disclosure to those skilled in the art, and will satisfy applicable legal requirements. Like numbers refer to like elements throughout. As used in this specification and the claims, the singular forms "a," "an," and "the" include plural referents unless the context clearly dictates otherwise.

Various embodiments described herein relate to a moisture barrier film for packaging, such as tobacco or cigarette packaging. The film comprises polylactic acid ("PLA") that is both biodegradable and transparent. In some arrangements, the film is corn-derived. The film includes multiple layers of PLA, with a base layer having a relatively high melting point compared to two outer layers, which have a relatively low melting point. The outer layers provide heat sealing capabilities to the film. In some arrangements, the film is coated with a metal oxide layer comprised of aluminum oxide, titanium oxide, and/or aluminum-titanium oxide having a coating thickness of 2-10 nm using an atomic layer deposition ("ALD") coating method. The ALD coating to the PLA film results in a moisture transmission rate of less than 4 $g/m^2/day$ after the film has been subjected to creasing, which induces cracking of the ALD metal oxide layer. Accordingly, the described film is suitable for use as a substitute for polypropylene film for overwrapping cigarette packs. The appearance of the PLA wrapped pack is similar to, or even better than, packs wrapped with the polypropylene film.

Moisture Barrier Film

Referring to FIG. 1, a cross-sectional view of an example film 100 is shown. The film 100 is a multi-layer film comprised of a base layer 102, an outer layer 104, and an inner layer 106. The base layer 102 is positioned between the outer layer 104 and the inner layer 106. The base layer 102, the outer layer 104, and the inner layer 106 have a combined thickness of between 15 and 30 microns thick. In some arrangements, the combined thickness of the base layer 102, the outer layer 104, and the inner layer 106 is 20 microns thick. In some arrangements, the thicknesses of the outer layer 104 and the inner layer 106 are each between 1 and 2 microns thick. In some arrangements, the base layer 102, the outer layer 104, and the inner layer 106 are formed and bonded together though a co-extrusion process. The film 100 may be rolled around a core after the extrusion process.

The outer layer 104 and the inner layer 106 are comprised of a first material. The first material is a first polylactic acid ("PLA") material. The first PLA material is transparent and biodegradable. In some arrangements, the first PLA material is corn-based. The first PLA material has a first melting temperature. In some arrangements, the first melting temperature is less than 120 degrees Celsius. In further arrangements, the first melting temperature is less than 100 degrees Celsius. The base layer 102 is comprised of a second material that is transparent and that has a second melting temperature. The second melting temperature is higher than the first melting temperature, which provides the film 100 with heat sealing capabilities. In some arrangements, the second material is a second polylactic acid material. The second PLA material may be corn-based. In other arrangements, the second material is a bio-based polypropylene. In further arrangements, the second material is the first PLA material that has been modified to have a higher melting temperature than the first melting temperature. In some arrangements, the second melting temperature is between 130 and 220 degrees Celsius.

The film 100 includes a coating 108. The coating 108 provides a moisture barrier to the film 100. The coating 108 is applied to the free surface of the outer layer 104 such that the outer layer 104 is positioned between the coating 108 and the base layer 102. In some arrangements, the coating 108 is also applied to the free surface of the inner layer 106 such that the inner layer 106 is positioned between the coating 108 and the base layer 102.

The coating 108 is a transparent or substantially transparent metal oxide coating. In some arrangements, the coating 108 is an aluminum-titanium oxide ("ATO"). In other arrangements, the coating 108 is an aluminum oxide or a titanium oxide. Coatings made from the ATO are more flexible and more crack-resistant than coatings made from aluminum oxide or titanium oxide. In other arrangements, the coating comprises other metal oxides, such as silicon dioxide ($SiO_2$), zinc oxide (ZnO), or the like. The coating 108 is applied to the film through an atomic layer deposition ("ALD") process. In some arrangements, the ALD process occurs under vacuum. In other arrangements, the ALD process occurs at atmospheric pressure. In some arrangements, the ALD chamber has a temperature of less than 100 degrees Celsius. The ALD process may be a thermal ALD process or a plasma enhanced ALD ("PEALD") process. During the ALD process, the roll of film 100 without the coating 108 is fed through an ALD coating machine, in which the film 100 is subjected to exposures of metal precursor(s) and oxidizers to deposit the desired ALD coating on the film 100. In some arrangements, the ALD coating is only applied on one side of the film 100. In other arrangements, the ALD coating is applied on both sides of the film 100 either during a single pass or through multiple passes of the film 100 through the ALD coating machine. Accordingly, the metal oxide is deposited on the film 100 (e.g., on the outer layer 104 and/or on the inner layer 106) to form the coating 108. In some arrangements, the coating 108 is formed to a thickness of 3 nanometers.

As described above, the coating 108 provides a moisture barrier to the film 100. After the film is coated with the coating 108, the film 100 has a moisture transmission rate of less than 4 $g/m^2/day$ after the film 100 has been subjected to creasing (e.g., as would be done when using the film to wrap a package). The creasing induces cracking of the coating 108. In some arrangements, the film 100 has a moisture transmission rate of less than 2 $g/m^2/day$ after the film 100 has been subjected to creasing.

As described in further detail below, the film 100 can be used as a wrapping around packaging products to seal the contents within the packaging from the ambient. The resulting packaging products wrapped in the film have both moisture barrier characteristics and heat sealability characteristics.

Method of Making Moisture Barrier Film

In various embodiments, the invention described herein relates to a method of making the film 100. Referring to FIG. 2, a flow diagram of a method 200 of making the moisture barrier film 100 is shown according to an example embodiment.

The method 200 begins when the base layer 102 of the film is formed. In some arrangements, the base layer 102 is formed by extruding the second material to form a film of the base layer 102. The base layer 102 is formed to have a thickness between 13 and 26 microns. In some arrangements, the base layer 102 is formed to have a thickness of 16 to 18 microns. As described above, in some arrangements the second material is a PLA material. The PLA material may be corn-based. In other arrangements, the second material is a bio-based polypropylene.

The outer layer 104 is formed at 204. In some arrangements, the outer layer 104 is formed by extruding the first material over one side of the base layer 102. The outer layer 104 is formed to have a thickness between 1 and 2 microns. As described above, the first material is a PLA material, such as a corn-based PLA material.

The inner layer is formed at 206. In some arrangements, the inner layer 106 is formed by extruding the first material over the side of the base layer 102 opposite the outer layer 104. The inner layer 106 is formed to have a thickness between 1 and 2 microns. As described above, the first material is a PLA material, such as a corn-based PLA material.

In some arrangements, the base layer 102, the outer layer 104, and the inner layer 206 are formed in a single manufacturing process, such as a co-extrusion manufacturing process.

The partially completed film comprising the base layer 102, the outer layer 104, and the inner layer 106 is wrapped around a core to form a roll of partially completed film at 208. In some arrangements, the partially completed film is wound around the core as the partially completed film exits the extrusion machine or machines. Wrapping the partially completed film around the core to form a roll of the partially completed film allows for easy storage and transportation of the partially completed film.

The coating 108 is applied at 210. The partially completed film is fed from the roll into an ALD coating machine. As the partially completed film is fed through the ALD coating machine, the coating 108 is deposited on the outer surface of the outer layer 104. The ALD coating machine may utilize a PEALD process. In some arrangements, the ALD chamber of the ALD coating machine has a temperature of less than 100 degrees Celsius during the ALD coating process. In some arrangements, the thickness of the coating 108 is between 2 and 10 nanometers thick. In further arrangements, the thickness of the coating 108 is 3 nanometers thick. In some arrangements, the coating 108 is an ATO. In other arrangements, the coating 108 is an aluminum oxide or a titanium oxide. In further arrangements, the coating 108 comprises other metal oxides, such as silicon dioxide ($SiO_2$), zinc oxide (ZnO), or the like. In some embodiments, the ALD coating machine also applies the coating 108 to the outer surface of the inner layer 106. In such embodiments, the coating 108 can be applied to both sides in a single pass of the film 100 through the ALD coating machine, or through multiple passes of the film 100 through the ALD coating machine. The total thickness of the completed film 100 is between 15 and 30 microns thick. In some arrangements, the total thickness of the film is 20 microns thick.

The completed film 100 is wrapped around a core to form a roll of completed film 100 at 212. After exiting the ALD coating machine, the film 100 is wrapped around a core to form a roll of the completed film 100. The roll of completed film 100 can be stored for later processing or use. Wrapping the completed film 100 around the core to form a roll of the completed film 100 allows for easy storage and transportation of the completed film 100.

Package Wrapped in Moisture Barrier Film

In various embodiments, the invention described herein relates to a package that is wrapped in the moisture barrier film 100. For example, the package may be a cigarette pack, such as those described in U.S. Pat. No. 4,852,734 to Allen et al.; U.S. Pat. No. 8,522,515 to Carter et al.; U.S. Pat. No. 8,118,161 to Guerrera et al.; U.S. Pat. No. 7,823,731 to Wu; U.S. Pat. No. 7,228,961 to Koetter et al.; U.S. Pat. No. 7,048,115 to Stringfield; U.S. Pat. No. 7,014,039 to Henson et al.; U.S. Pat. No. 6,364,106 to Fagg et al.; U.S. Pat. No. 5,379,889 to Cobler et al.; U.S. Pat. No. 5,248,031 to Burrows et al.; U.S. Pat. No. 5,139,140 to Burrows et al.; and U.S. Pat. No. 4,807,745 to Langley et al.

FIG. 3 shows a perspective view of a cigarette pack 300. The cigarette pack 300 includes a top lid 302 and a main body 304. The top lid 302 and the main body 304 are comprised of a paper material, which is at least partially permeable to moisture. As shown in FIG. 4, the top lid 302 can be rotated away from the main body 304 along a hinge 402 formed from a crease in the paper material. When the top lid 302 is rotated away from the main body 304, a central compartment 404 is revealed. The central compartment 404 is sized and shaped to store cigarettes in any of the manners described in the above-incorporated patent references. When the top lid 302 is closed (e.g., as shown in FIG. 3), the central compartment 404 is partially sealed from the ambient environment. However, moisture can still pass through the paper material (e.g., into the central compartment 404 or out of the central compartment 404).

Accordingly, after the contents (e.g., cigarettes) are loaded into the central compartment 404, the top lid 302 is closed and the pack 300 is wrapped in the film 100. As shown in FIG. 5, the pack 300 is wrapped in the film 100. The film 100 is folded and creased to form overlapping flaps 502 and 504. The flaps 502 and 504 are sealed with heat. When exposed to the heat, the outer layer 104 and the inner layer 106 become pliable and partially melt to stick the flaps 502 and 504 to each other forming a seal between the flaps 502 and 504. After the flaps 502 and 504 are sealed, the film 100 provides a moisture barrier to the pack 300 to keep the contents in the central compartment at the appropriate humidity level until the film 100 is removed from the pack 300.

Method of Making a Cigarette Pack Wrapped with the Moisture Barrier Film

In various embodiments, the invention described herein relates to a method of making a cigarette pack wrapped in the film 100 (e.g., cigarette pack 300 as shown in FIG. 5). Referring to FIG. 6, a flow diagram of a method 600 of making a cigarette pack wrapped in the film 100 is shown according to an example embodiment. The method 600 may be performed by a cigarette pack manufacturing machine.

The method 500 begins when a cigarette pack 300 is formed at 602. The cigarette pack 300 is formed by folding a packaging blank along crease lines and securing the cigarette pack with adhesive. Contents are inserted into the cigarette pack 300 at 604. The contents may be, for example, cigarettes that are loaded into the central compartment 404. After the contents are loaded into the cigarette pack 300 at 604, the cigarette pack 300 is closed at 606. The top lid 302 of the cigarette pack 300 is closed. The cigarette pack 300 is wrapped in the film 100 at 608, and the film 100 is sealed at 610. The film 100 is sealed by applying heat to the flaps 502 and 504.

Many modifications and other aspects of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific aspects disclosed and that equivalents, modifications, and other aspects are intended to be included within the scope of the appended claims. Although specific terms are employed herein, they are used in a generic and descriptive sense only and not for purposes of limitation.

That which is claimed:

1. A method of making a film having a moisture barrier coating, the method comprising:

forming a base layer consisting essentially of a first poly(lactic acid) (PLA) or polypropylene material having a first melting point;

forming an outer layer comprising a second material comprising PLA having a second melting point, the second melting point is lower than the first melting point;

a first side of the outer layer bonded to a first side of the base layer;

forming an inner layer comprising the second material, a first side of the inner layer bonded to a second side of the base layer, the second side of the base layer opposite the first side of the base layer; and coating each of a second side of the outer layer and a second side of the inner layer with a moisture barrier coating comprising a metal-oxide via atomic layer deposition, the second side of the outer layer opposite the first side of the outer layer and the second side of the inner layer opposite the first side of the inner layer, wherein the moisture barrier coating has a thickness in the range of 2-10 nm.

2. The method of claim 1, further comprising wrapping the film around a core to form a roll of the film.

3. The method of claim 1, wherein the atomic layer deposition process occurs under vacuum.

4. The method of claim 1, wherein the base layer and the outer layer are formed through an extrusion process.

5. The method of claim 1, wherein the first material is a first polylactic acid material, and the second material is a second polylactic acid material.

6. The method of claim 5, wherein at least one of the first polylactic acid material or the second polylactic acid material are corn-based.

7. The method of claim 1, wherein the first material is a bio-based polypropylene.

8. The method of claim 1, wherein the moisture barrier coating is transparent.

9. The method of claim 1, wherein the moisture barrier coating is at least one of an aluminum oxide, a titanium oxide, or an aluminum-titanium oxide.

10. The method of claim 1, wherein the film has a moisture transmission rate of less than 4 grams per meter squared per day.

11. The method of claim 10, wherein the film has a moisture transmission rate of less than 2 grams per meter squared per day.

12. The method of claim 1, wherein the film is between 15 and 30 microns in thickness.

* * * * *